United States Patent
Shum et al.

(10) Patent No.: US 8,153,475 B1
(45) Date of Patent: Apr. 10, 2012

(54) BACK-END PROCESSES FOR SUBSTRATES RE-USE

(75) Inventors: Frank Tin Chung Shum, Sunnyvale, CA (US); Thomas M. Katona, Goleta, CA (US); Michael Ragan Krames, Los Altos, CA (US)

(73) Assignee: Sorra, Inc., Goleta, CA (US)

( * ) Notice: Subject to any disclaimer, the term of this patent is extended or adjusted under 35 U.S.C. 154(b) by 0 days.

(21) Appl. No.: 12/858,379

(22) Filed: Aug. 17, 2010

Related U.S. Application Data

(60) Provisional application No. 61/234,767, filed on Aug. 18, 2009.

(51) Int. Cl.
*H01L 21/44* (2006.01)
*H01L 21/48* (2006.01)

(52) U.S. Cl. . 438/113; 438/118; 438/670; 257/E21.601; 257/E21.025; 257/E21.034

(58) Field of Classification Search ............ 438/107, 438/110, 113, 118, 577, 670, 951; 257/E21.601; 257/E21.025, E21.034
See application file for complete search history.

(56) References Cited

U.S. PATENT DOCUMENTS

| | | | |
|---|---|---|---|
| 6,853,010 B2 | 2/2005 | Slater, Jr. et al. | |
| 7,053,413 B2 | 5/2006 | D'Evelyn et al. | |
| 7,148,515 B1 | 12/2006 | Huang et al. | |
| 7,220,324 B2 | 5/2007 | Baker et al. | |
| 7,252,408 B2 | 8/2007 | Mazzochette | |
| 7,253,446 B2 | 8/2007 | Sakuma et al. | |
| 7,338,828 B2 | 3/2008 | Imer et al. | |
| 7,550,305 B2 * | 6/2009 | Yamagata et al. | 438/29 |
| 2006/0065900 A1 | 3/2006 | Hsieh et al. | |
| 2006/0152795 A1 | 7/2006 | Yang | |
| 2006/0208262 A1 | 9/2006 | Sakuma et al. | |
| 2006/0240585 A1 * | 10/2006 | Epler et al. | 438/22 |
| 2006/0262545 A1 | 11/2006 | Piepgras et al. | |
| 2009/0173958 A1 | 7/2009 | Chakraborty | |
| 2009/0315965 A1 * | 12/2009 | Yamagata et al. | 347/130 |
| 2010/0003492 A1 | 1/2010 | D'Evelyn | |
| 2010/0025656 A1 | 2/2010 | Raring et al. | |
| 2010/0060130 A1 | 3/2010 | Li | |
| 2011/0140150 A1 | 6/2011 | Shum | |
| 2011/0182056 A1 | 7/2011 | Trottier et al. | |
| 2011/0182065 A1 | 7/2011 | Negley et al. | |
| 2011/0186874 A1 | 8/2011 | Shum | |
| 2011/0186887 A1 | 8/2011 | Trottier et al. | |
| 2011/0198979 A1 | 8/2011 | Shum et al. | |
| 2011/0204763 A1 | 8/2011 | Shum et al. | |
| 2011/0204779 A1 | 8/2011 | Shum et al. | |
| 2011/0204780 A1 | 8/2011 | Shum et al. | |
| 2011/0215348 A1 | 9/2011 | Trottier et al. | |

OTHER PUBLICATIONS

U.S. Appl. No. 13/135,087 unpublished, filed Jun. 23, 2011, Trottier et al.
U.S. Appl. No. 12/914,789 unpublished, filed Oct. 28, 2010, Shum.
U.S. Appl. No. 61/257,303 unpublished, filed Nov. 2, 2009, Shum.
U.S. Appl. No. 61/256,934 unpublished, filed Oct. 30, 2009, Shum.
U.S. Appl. No. 61/241,457 unpublished, filed Sep. 11, 2009, Shum.
U.S. Appl. No. 61/241,455 unpublished, filed Sep. 11, 2009, Shum.

* cited by examiner

*Primary Examiner* — Hsien Ming Lee
(74) *Attorney, Agent, or Firm* — Kilpatrick Townsend & Stockton LLP

(57) ABSTRACT

A method for fabricating optical devices on a reusable handle substrate. The method includes providing a handle substrate having a surface region. The method also includes forming a plurality of optical device using at least an epitaxial growth process overlying the surface region and then releasing the handle substrate from the plurality of optical devices. The method reuses the handle substrate for another fabrication process.

12 Claims, 7 Drawing Sheets

Second Vacuum Chuck Mated to
Die After First Expansion

Two Rows of Die Released
During Second Expansion (If Necessary)

Thin-Die on Tape After Expansion

BACK-END PROCESSES FOR SUBSTRATES RE-USE

CROSS-REFERENCE TO RELATED APPLICATION

This application claims priority to U.S. Ser. No. 61/234,767, filed Aug. 18, 2009, commonly assigned, and hereby incorporated by reference for all purposes.

BACKGROUND OF THE INVENTION

The present invention is directed to the manufacture of optical devices. More particularly, the invention provides a re-use method and associated structures and in particular reuse of a handle substrate for a gallium and nitrogen containing material.

SUMMARY OF THE INVENTION

A method for fabricating optical devices on a reusable handle substrate. The method includes providing a handle substrate having a surface region. The method also includes forming a plurality of optical device using at least an epitaxial growth process overlying the surface region and then releasing the handle substrate from the plurality of optical devices. The method reuses the handle substrate for another fabrication process.

BRIEF DESCRIPTION OF THE DRAWINGS

FIG. 4 (cont) illustrates operation of a vacuum fixture to separate die in a perpendicular direction;

FIG. 5 (cont) illustrates additional steps in the process.

DETAILED DESCRIPTION OF THE PREFERRED EMBODIMENTS

Substrate-reuse is not common in the III-V semiconductor industry but becomes important when the cost of the substrate presents a majority cost of a device chip. This is the case today for bulk GaN which costs about 100× more per sq. in. than conventional substrates like sapphire.

Substrate-reuse first requires a means for lifting off the epitaxial device layers and leaving the substrate intact and suitable for re-working. Methods for providing a lift-off interface include i) insertion of heteroepitaxial layers (e.g., AlGaN or InGaN), ii) a change in doping (e.g., n++ or p++), iii) implantation (e.g., H+ implant and blistering), iv) insertion of dielectric layers (e.g., epitaxial lateral overgrowth), etc.

For example, a "lift-off" layer could be incorporated in epitaxy growth prior to the LED layers. This layer could have a substantially different doping level, or different composition, to enable selective etching to occur in later processing. For example, photoelectrochemical (PEC) etching is extremely sensitive to doping level, so the etch rate of the lift-off layer can be substantially higher than that of the surrounding layers. Also, PEC etching can be made selective by isolating absorbed light to the lift-off layer, for example by lowering the bandgap of that layer with respect to surrounding layers. Selective absorption can be enabled be provided by a conventional lamp using a cut-off filter, or by LED or laser light tuned to be selectively absorbed by the lift-off layer.

Figure 1:
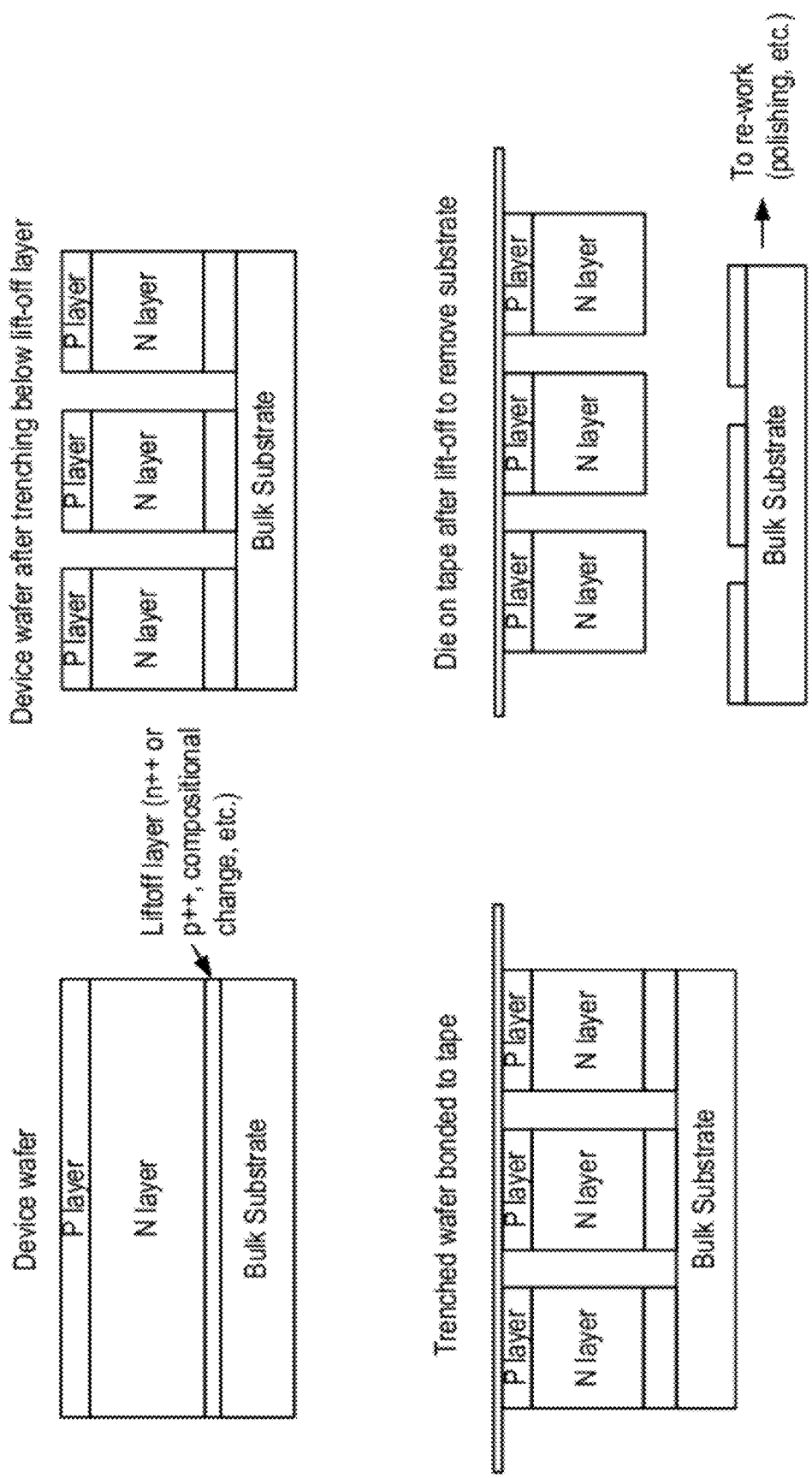
FIG. 1 is a process diagram illustrating a liftoff process.

FIG. 1 illustrates the P layer, the N layer, the liftoff layer, and the bulk substrate in the upper left portion of the figure. As shown in the upper right portion of the figure, a trenching operation, e.g. Iy etching, is performed to separate the die down to the bulk substrate. As shown in the lower left portion of the figure, the trenched wafer is then bonded to tape. Then, as shown in the lower right portion of the figure, a liftoff step is performed to remove the bulk substrate for rework. The die are now affixed only to the tape.

Regardless of the lift-off method, handling the lifted-off thin epitaxial device layers is a challenge and is not possible using conventional die pick-and-place technology (e.g., plunger and vacuum collet). Below are some ideas on how to handle these thin layers in the fabrication of LEDs.

A. Tape-Transfer and Expansion

The LED wafer (top-side metalized) is trench-etched to provide access to the lift-off layer on a pitch consistent with the desired final chip dimensions. The wafer is attached to tape and lift-off means are applied to remove the substrate, leaving individual thin-film chips on the tape. The tape is expanded around a tape-ring to increase separation between the die. The number of expansion steps chosen is that which provides the largest separation between chips without too much distortion of their positions in x,y on the tape. The die are tape-transferred so that the metalized chip surfaces face up (tape transfer can be used to increase the allowable number of expansion steps without too much distortion of die positions).

Figure 2:
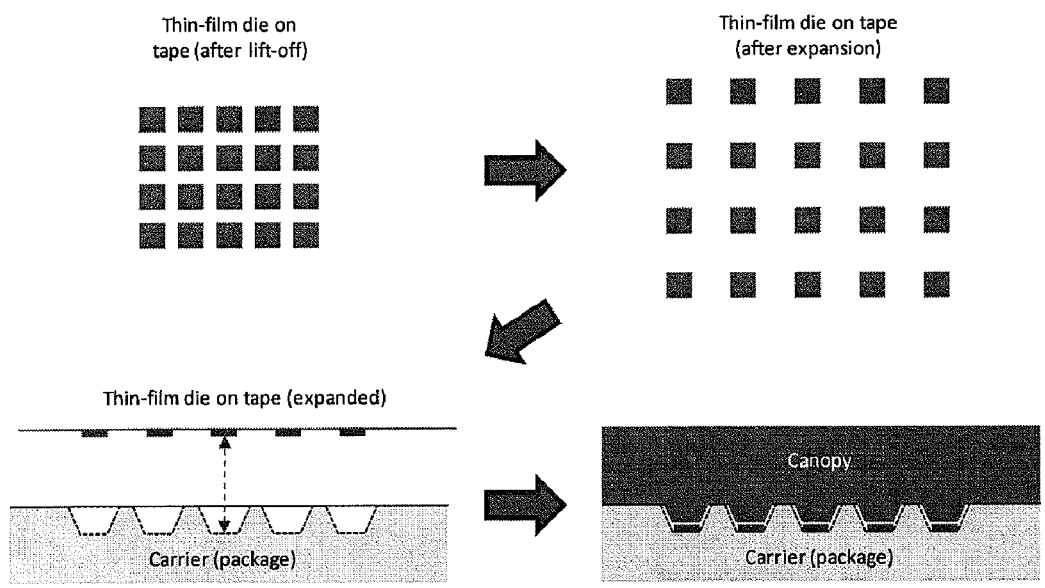
FIG. 2 is a diagram illustrating thin film die attached to a tape which is expanded.

FIG. 2 illustrates the steps described in the preceding paragraph. In particular, the upper left diagram illustrates a top view of the die affixed to the tape after the liftoff process shown in FIG. 1. The portion of the figure in the upper right illustrates the die on the tape after expansion, for example, after expansion using a tape ring. The lower left portion of the figure illustrates the expanded die being tape transferred so the metallized chip surfaces fit into the carrier package. The lower right portion of the figure illustrates the structure after placing a canopy on the carrier.

Now, the die are "gang-transferred" to a carrier substrate which comprises the main foundation of the LED package. Carrier substrates include metalized thin ceramic alumina or AlN, multi-layer Cu-ceramic co-fired stacks, dual-bonded Cu (DBC) substrates, Si wafers, etc. In one embodiment the transfer is made by aligning the die to attach-points on the carrier and releasing the die (e.g., UV exposure to UV sensitive tape, heating, agitation, etc.). Recesses in the carrier (e.g., grooves in Si) can be used to help align the die if positioning from expansion techniques is not entirely accurate. Attachment is completed by raising to reflow temperature (solder layers attached to carrier or die, or both). If necessary force may be applied to the die during re-flow by use of a canopy jig, for example. After attach the carrier may go back into wafer fabrication for applying the final electrode metallization to complete the LED (due to run-out issues on ceramic-based packages this step is most readily facilitated by use of a Si-based carrier).

In a variation of the bonding process, the LED dies after tape expansion is transferred onto a low tack kapton tape. The kapton tape provides a flexible membrane that can withstand the high temperatures die bonding reflow process. The substrate onto which the dies are to be bonded is sandwich between 2 pieces of kapton tape material, one of which contains the LED dies. The perimeter of the 2 pieces of kapton tape is sealed by a crimping fixture. A vacuum is pulled on the region between the two kapton material resulting in a constant and even pressure across all the dies against the substrate. Heat is applied causing the solder material to reflow and the LED dies become attached to the substrate.

Figure 3:
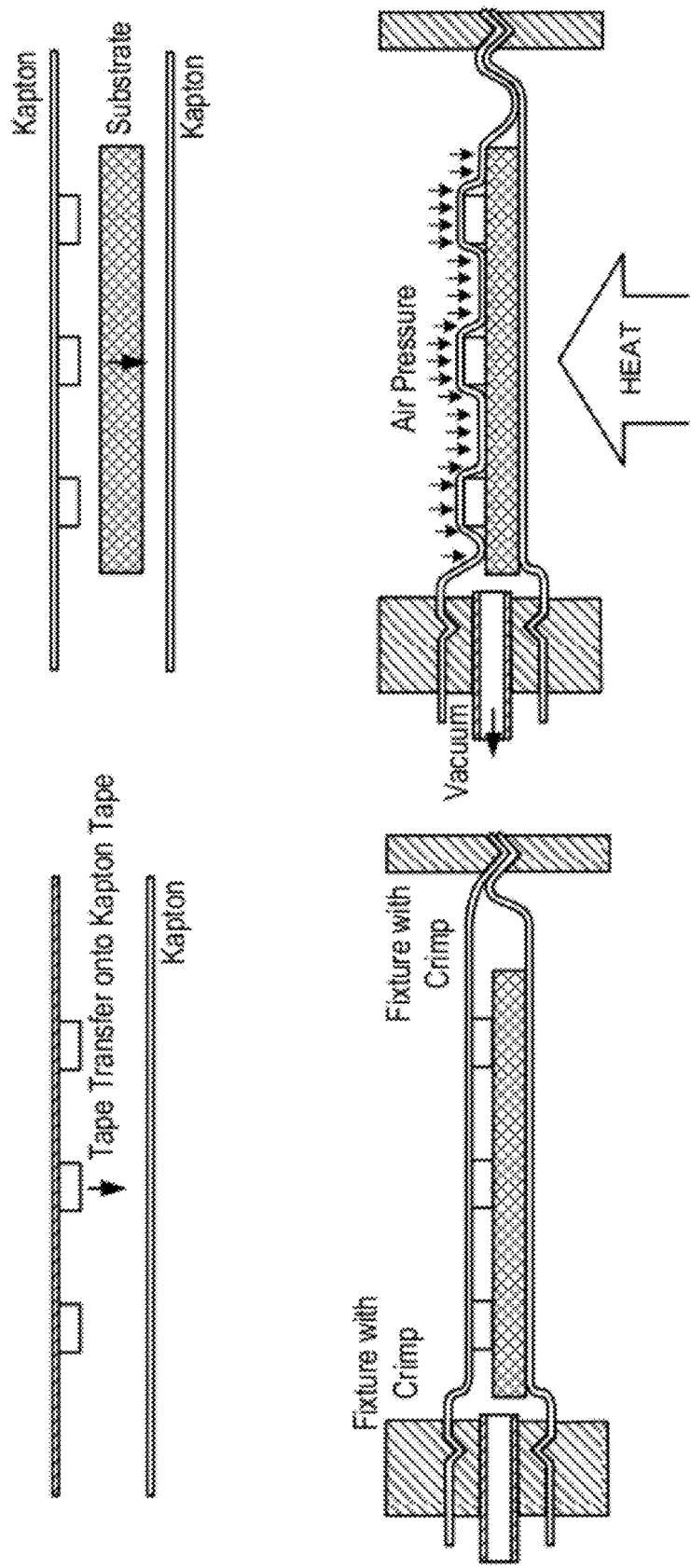
FIG. 3 is a series of cross-sectional views illustrating attachment of die to a substrate.

FIG. 3 illustrates the steps performed which are described in the paragraph above. In this variation of the liftoff process, after expansion of the tape, the dies are transferred to a Kapton tape. The dies on the Kapton tape are then positioned above a substrate. Another Kapton tape, as shown in the upper right portion of the figure, is positioned below the substrate. Then, as shown in the lower left portion of the figure they are positioned between two fixtures and the ends crimped shut around a tube. A vacuum source is connected to the tube and heat applied to the assembly to cause the solder material to reflow and attach the LEDs to the substrate.

B. Vacuum-Chuck Tooling for Expansion

Tape expansion as described above is commonly used in the semiconductor industry as a means of increasing the separation between die after the singulation process. The increased die separation is need to allow for automated transfer from the tape to a subsequent substrate. This transfer is typically performed by an automated pick and place system (e.g., plunger and vacuum collet) which picks and places the die on an individual basis, typically using machine vision to correct for any variation in the magnitude of the X-Y expansion during the tape expansion process. To allow for a wafer level die transfer process to be achievable after singulation (for example to an array of LED packages), an accurate means to expand the die to match the step and repeat distance of the matching packages must be developed.

One method by which this process could be accomplished that has relevance both for thin film die, as would be produced during a substrate liftoff process, or for conventional thick-film die, is to design a vacuum chuck with holes that mate to the post singulated wafer, has automated step and repeat capability, and has individually addressable control of the vacuum holes by row or column. This tooling and associated process could either be used to develop a means of providing more accurate control of the die expansion process with regards to finished geometrical spacing that allows for wafer level to substrate die transfer, or could be utilized to directly transfer die to a suitable substrate. Both processes are shown below. In this implementation, the geometrical expansion is limited by the accuracy of the control equipment, instead of dictated by the uniformity in pull strength around the perimeter of a typical tape expansion system, allowing for more controllable die spacing. The die spacing is critical to any subsequent wafer level transfer processes that would substantially reduce packaging costs compared with current state-of-the-art processes.

Figure 4:
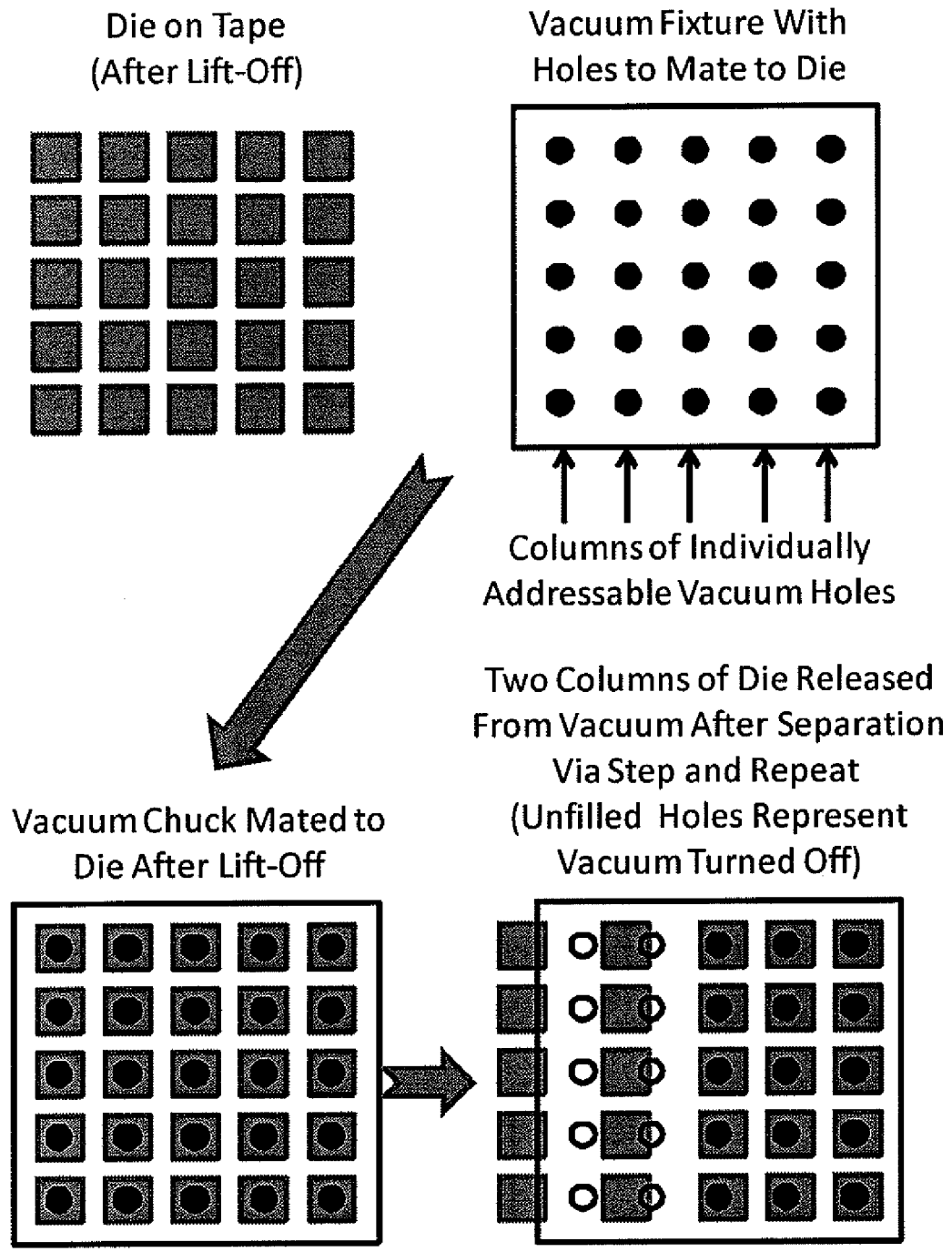
FIG. 4 illustrates operation of a vacuum fixture to separate die in a first direction.
Figure 4:
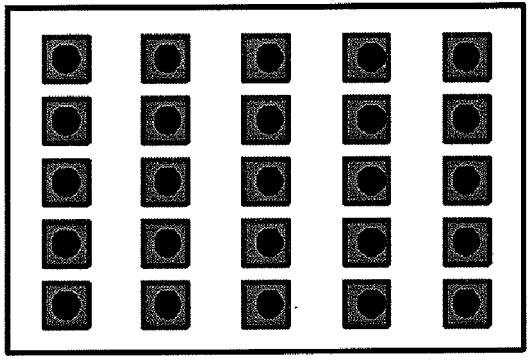
Figure 4:
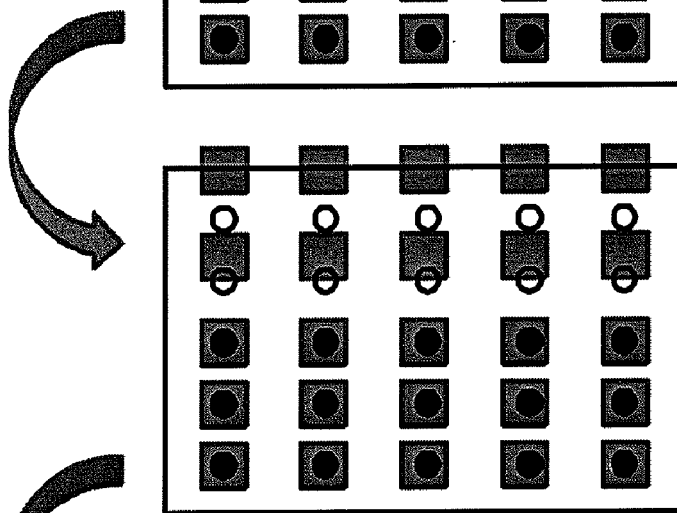
Figure 4:
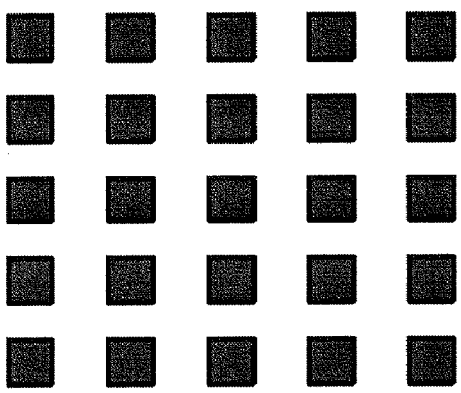

FIG. 4 illustrates process steps carried out which are described in the preceding paragraph. In particular, as shown, after liftoff and expansion, the die are mated to a vacuum fixture which has holes arranged in an array to match the die arrangement on the tape. Once the die are mated to the chuck, the die may be released selectively, e.g. row-by-row onto a substrate using a step and repeat approach, as shown in the lower right corner of the figure.

The die may now be attached to a carrier (package) using either of the gang-die-attach methods described in sec. A.

Figure 5:
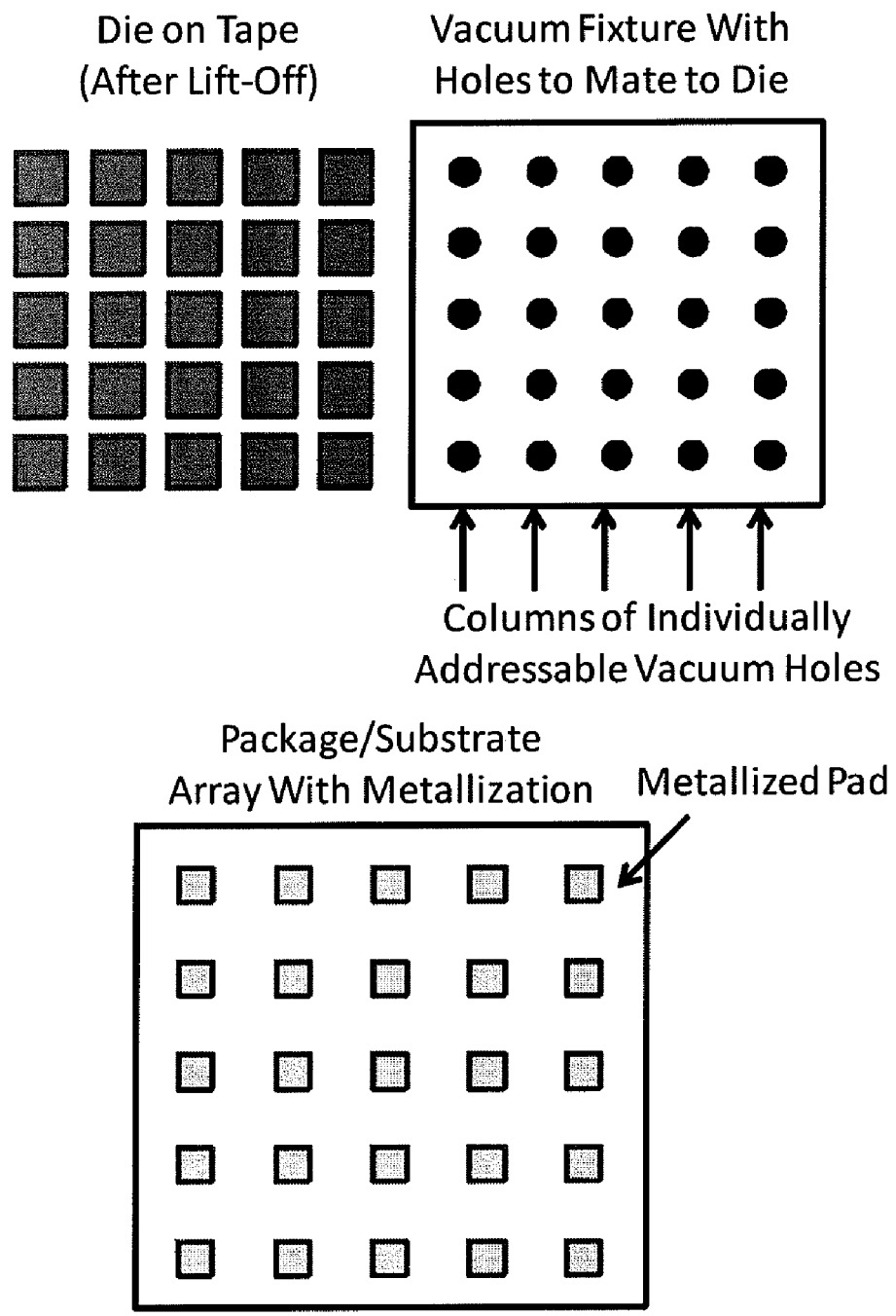
FIG. 5 illustrates direct transfer of die to a substrate.
Figure 5:
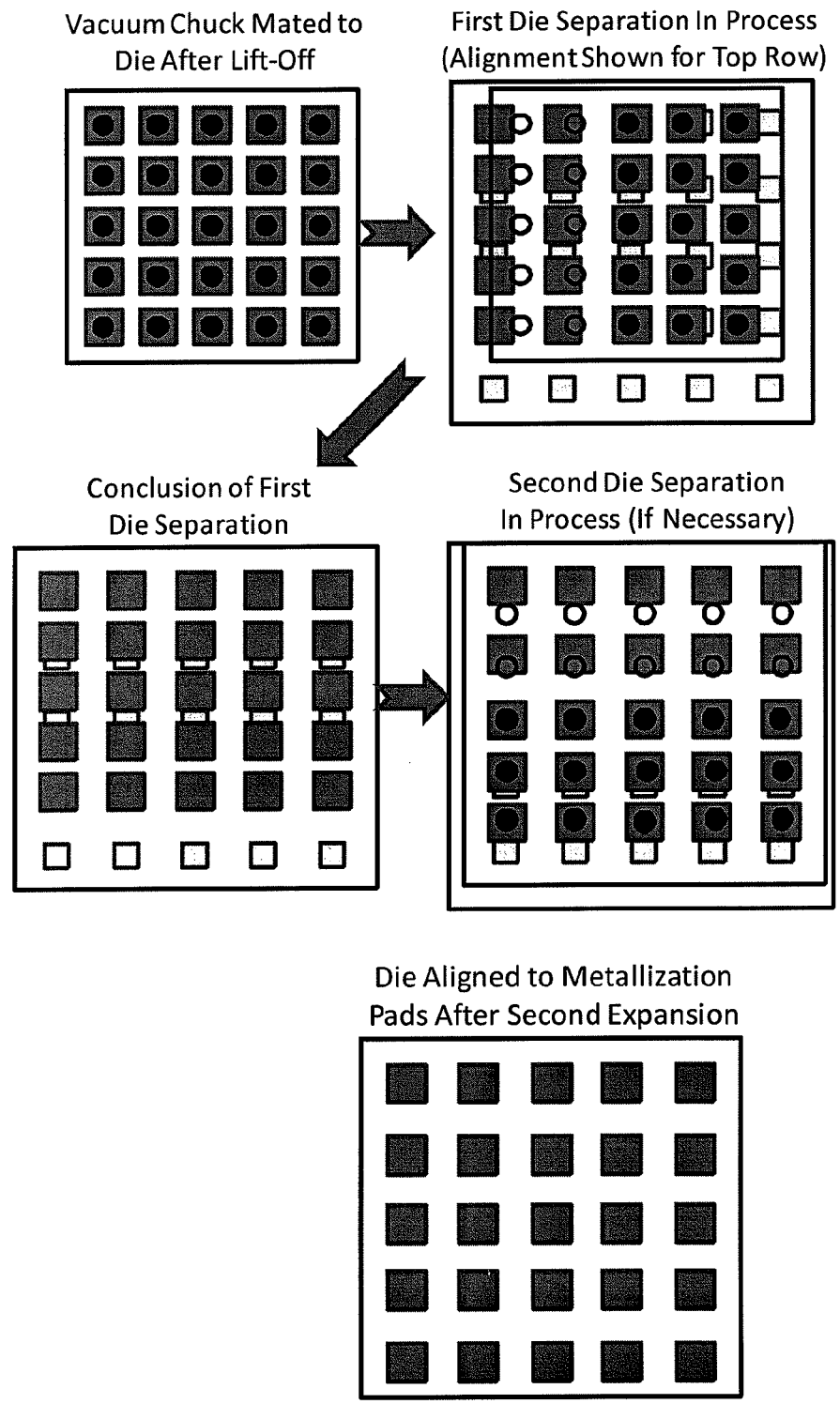

The Second Implementation With Direct Transfer to a Host Substrate or Package Array Substrate is shown in FIG. 5. As shown there, using the same technique as described in FIG. 4, the second vacuum chuck can be mated to the die to provide further expansion if needed.

The invention claimed is:

1. A method for fabricating a plurality of optical devices comprising:
   providing a bulk substrate having a top surface;
   forming a liftoff layer on the top surface of the bulk substrate;
   forming at least two layers of semiconductor material on the liftoff layer, the at least two layers of semiconductor material having an upper surface;
   dividing the at least two layers of semiconductor material into separate die regions electrically isolated from each other by forming trenches through the at least two layers of semiconductor material and through the liftoff layer down to the bulk substrate;
   attaching the upper surface of the now separate die regions to a layer of adhesive material;
   using the liftoff layer, separating the at least two layers of semiconductor material from the bulk substrate;
   expanding the layer of adhesive material to move the die regions further apart from each other;
   by use of the layer of adhesive material, positioning the die regions on a first substrate for further processing;
   affixing the die regions to the first substrate;
   reusing the bulk substrate for a subsequent process.

2. A method as in claim 1 wherein after the step of expanding the adhesive layer, the layer of adhesive material is used to position the die regions on a carrier.

3. A method as in claim 1 wherein the at least two layers of semiconductor material provide a light emitting diode.

4. A method as in claim 1 wherein after expanding the layer of adhesive material to move the die regions further apart from each other; the die regions are transferred to a first sheet of Kapton film.

5. A method as in claim 4 wherein the first sheet of Kapton film is used to position separate die regions on one surface of the first substrate.

6. A method as in claim 5 further comprising affixing a second sheet of Kapton film to an opposite surface of the first substrate.

7. A method as in claim 6 further comprising subjecting the first substrate with the first and second sheets of Kapton film to a vacuum.

8. A method as in claim 7 wherein following the step of subjecting the substrate to a vacuum, a step of heating the substrate is performed to attach the die regions to the first substrate.

9. A method as in claim 1 wherein the step of expanding comprises use of a tape ring.

10. A method as in claim 1 further comprising using a vacuum chuck to mate with the die regions and position the die regions over the first substrate to which the die regions subsequently are attached.

11. A method as in claim 10 wherein the vacuum chuck is used for positioning the die regions and then mating the die regions to the first substrate.

12. A method as in claim 11 wherein the first substrate includes metallized regions to which the die regions are bonded.

* * * * *

UNITED STATES PATENT AND TRADEMARK OFFICE
CERTIFICATE OF CORRECTION

PATENT NO.         : 8,153,475 B1                         Page 1 of 1
APPLICATION NO.    : 12/858379
DATED              : August 17, 2010
INVENTOR(S)        : Frank Tin Chung Shum et al.

It is certified that error appears in the above-identified patent and that said Letters Patent is hereby corrected as shown below:

On the Title page, of U.S. PATENT 8,153,475 B1:

Field 73, naming Assignee, please delete "Sorra, Inc."
and insert --Soraa, Inc.--

In the Claims Section, of U.S. PATENT 8,153,475 B1:

Claim 8, column 4, line 48, please delete "subjecting the substrate to a vacuum, a step of heating the substrate"

and insert --subjecting the first substrate to the vacuum, a step of heating the first substrate--

Signed and Sealed this
Eleventh Day of September, 2012

David J. Kappos
*Director of the United States Patent and Trademark Office*